(12) United States Patent
Shin

(10) Patent No.: US 7,262,091 B2
(45) Date of Patent: Aug. 28, 2007

(54) METHODS OF FABRICATING MIM CAPACITORS

(75) Inventor: Yong-Wook Shin, Gwangju (KR)

(73) Assignee: Dongbu Electronics Co., Ltd., Seoul (KR)

( * ) Notice: Subject to any disclaimer, the term of this patent is extended or adjusted under 35 U.S.C. 154(b) by 54 days.

(21) Appl. No.: 11/319,692

(22) Filed: Dec. 28, 2005

(65) Prior Publication Data

US 2006/0148169 A1   Jul. 6, 2006

(30) Foreign Application Priority Data

Dec. 30, 2004   (KR) .................. 10-2004-0117163

(51) Int. Cl.
*H01L 21/8242*   (2006.01)

(52) U.S. Cl. ................ 438/250; 438/253; 438/396; 257/E29.345

(58) Field of Classification Search .............. 438/3, 438/238–240, 250–256, 393–399; 257/29.345
See application file for complete search history.

(56) References Cited

U.S. PATENT DOCUMENTS

2006/0017136 A1*  1/2006  Won et al. ............. 257/532

* cited by examiner

*Primary Examiner*—H. Jey Tsai
(74) *Attorney, Agent, or Firm*—Andrew D. Fortney

(57) ABSTRACT

Methods of fabricating MIM capacitors are provided. One example method includes forming an insulating layer including a void on a semiconductor substrate, forming a first hole connected to the void by patterning the insulating layer, forming a lower electrode by forming a tungsten layer filling in the first hole such that the tungsten flows into the void, forming a dielectric layer, forming a second hole penetrating the dielectric layer and protruding toward the insulating layer, forming a connecting contact connected to the lower electrode by filling in the second hole, and forming an upper electrode on the dielectric layer.

9 Claims, 3 Drawing Sheets

METHODS OF FABRICATING MIM CAPACITORS

TECHNICAL FIELD

The present disclosure relates to fabricating semiconductor devices and, more particularly, to methods of fabricating metal-insulator-metal (MIM) capacitors.

BACKGROUND

As semiconductor devices have come to be more integrated and to have higher capacity, an MIM capacitor has been more frequently used in semiconductor devices. Accordingly, a method for reducing a manufacturing cost of an MIM capacitor is being investigated by eliminating both a mask and an insulating layer used as a dielectric layer that are involved in the fabrication of such an MIM capacitor.

A capacitor used for analog semiconductor devices is usually formed to have an insulating layer between polysilicons. However, a capacitor having an insulating layer between metals, such as an MIM capacitor, has recently been used for high-voltage products or System on Chip (SoC) products.

However, as design rules of a semiconductor device have been reduced, a void frequently occurs in the manufacturing process of ordinary CMOS semiconductor devices, which becomes one of deposition characteristics of an oxide layer used as the insulating layer. Such a void widely occurs in modern manufacturing processes of semiconductor devices involving, for example, a nano process or an SoC process, and a method for overcoming such a void is being investigated.

FIG. 1 and FIG. 2 are schematic diagrams illustrating an occurrence of a void created when forming an insulating layer of a conventional semiconductor device.

Referring to FIG. 1, because the size of a conventional semiconductor device such as unit transistor has become smaller, a field oxide layer 15 is firstly formed in order to insulate between active regions within a well 11 of a semiconductor substrate 10. A gate 20 of a transistor, including a polysilicon layer 23 and a silicide layer 25, is formed on a gate oxide layer 21. A spacer 27 is introduced at the sidewall of the gate 20, and a source/drain region 24 is formed by an impurity implant process in order to form other terminals of a transistor.

When a transistor is formed in such a way, a process for depositing an insulating layer 30 is performed in order to connect terminals (a CMOS device has four terminals) of a transistor to outside the transistor. Such an insulating layer 30 is usually introduced as a multi-layer structure. For example, the insulating layer 30 is formed by deposition of first, second, and third insulating layers 31, 33, and 35 having slightly different characteristics. In addition, such an insulating layer 30 is formed with an oxide layer base.

Due to deposition of the insulating layer 30, a void 37, which is an empty space in the insulating layer 30, may be created in the region where the height difference is great, because the insulating layer 30 is deposited more at an area having a large height difference than at an area having a small height difference.

Such an empty space is more frequently created in manufacturing a smaller transistor. Such a void 37 existing in the insulating layer 30 may result in a short-circuit. If a contact 41 is formed in the area having such a void 37 in order to connect a metal line 45 to a junction, such as drain region 24, the contact 41 may be connected to an adjacent contact through the void 37. In this case, as shown in FIG. 2, an electric current between adjacent transistors may consequently be applied through a conductive residual layer 47 filling in the void 37.

If such a connection problem of a contact 41 does not occur, such a void 37 and residual layer 47 may not cause severe problems of a semiconductor device itself. However, a parasitic capacitor in terms of a final product can be caused by such a void 37 and residual layer 47, and it may result in a time-delay or an alteration of the characteristics of memory data because unexpected particles, such as electrons or holes, may be contained in such a void 37 or/and residual layer 47. Therefore, it may severely deteriorate the reliability of a final product in the long run.

Therefore, a solution for overcoming such a void is being investigated in the current level of semiconductor technology.

Figure 1:
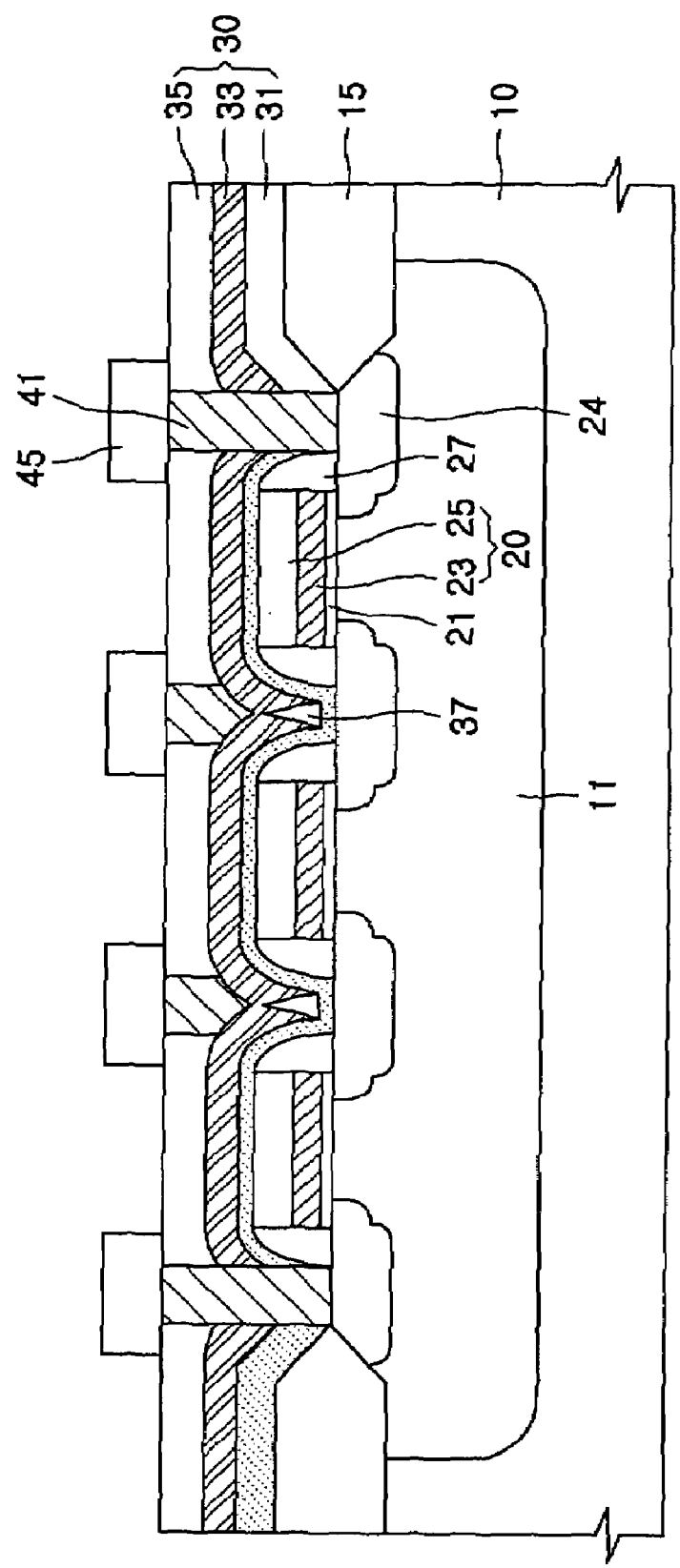
FIG. 1 and FIG. 2 are schematic diagrams illustrating a void that occurs while forming an insulating layer of a conventional semiconductor device.
Figure 2:
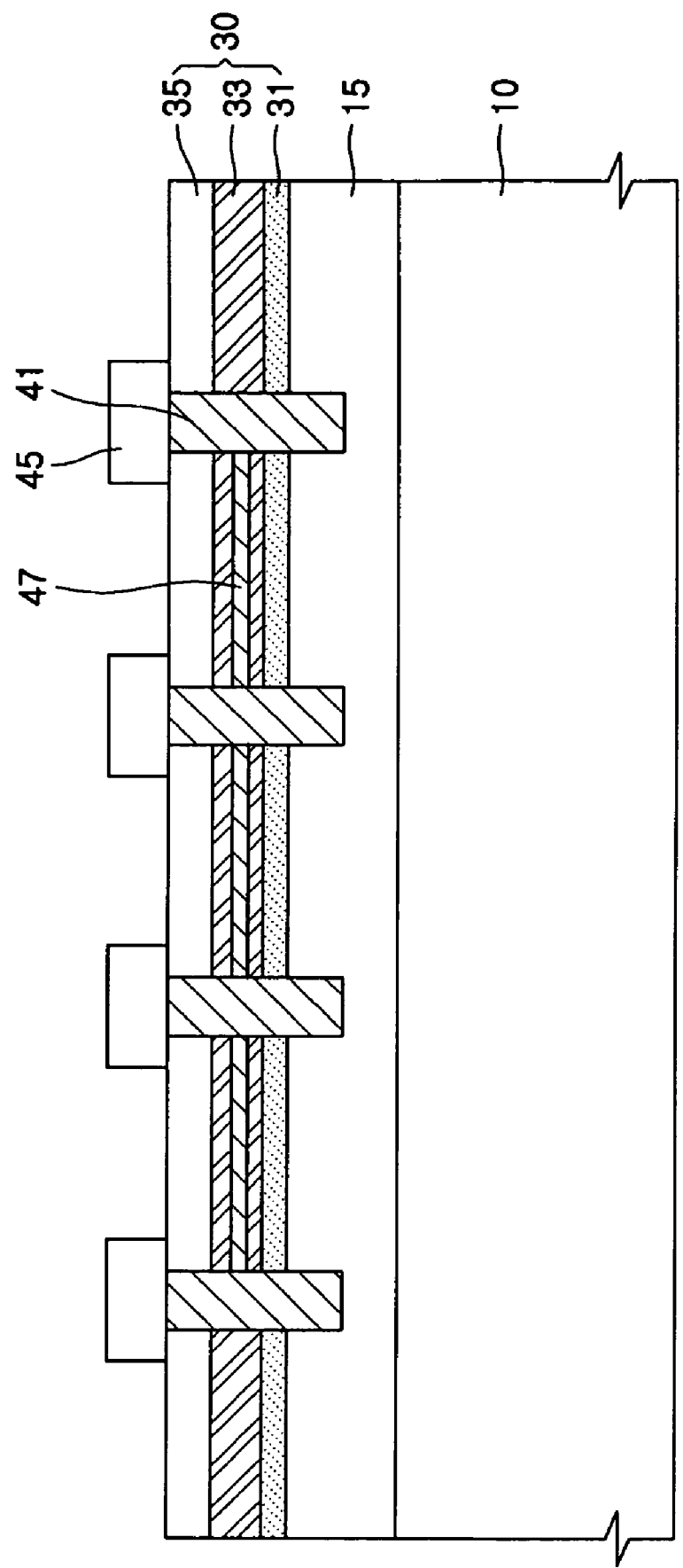

To clarify multiple layers and regions, the thickness of the layers are enlarged in the drawings. Wherever possible, the same reference numbers will be used throughout the drawing(s) and accompanying written description to refer to the same or like parts. As used in this patent, stating that any part (e.g., a layer, film, area, or plate) is in any way positioned on (e.g., positioned on, located on, disposed on, or formed on, etc.) another part, means that the referenced part is either in contact with the other part, or that the referenced part is above the other part with one or more intermediate part(s) located therebetween. Stating that any part is in contact with another part means that there is no intermediate part between the two parts.

DETAILED DESCRIPTION

In one example, the disclosed method of fabricating an MIM capacitor uses a characteristic of a void created in a 1.0 μm design rule or below, among various characteristics of an insulating oxide layer used for insulation between a polysilicon and a metal wire.

In addition, according to one disclosed example, a method of fabricating an MIM capacitor which is most frequently introduced in modern semiconductor processes involving, for example, a nano process or an SoC process. For the purpose of manufacturing such an MIM capacitor, the processes disclosed herein use a void, one of the characteristics of a deposited insulating-oxide layer used for an insulating layer in the manufacturing process of general CMOS semiconductor devices.

Generally, when a contact is formed for a metal wire, a void created in an insulating layer may induce a short-circuit between contacts because residues of silicon remain in such a void during the subsequent polysilicon process. Therefore, such a void induces defects of a pattern by connecting devices inappropriately, or deteriorates a quality of a product related to the operation speed by forming a parasitic capacitor due to a change of the dielectric constant between an upper wire and a lower wire.

In addition, when a reliability test is performed for a device having such a void, the reliability of the device is deteriorated because a void mainly induces cracking of an oxide layer or puffing by thermal expansion. Therefore, a great deal of research for eliminating such a void in an insulating layer is continuously being conducted.

However, as disclosed herein, such a void in an insulating layer can be used for forming a lower electrode of a metal capacitor. If contact materials are induced to remain in such a void, and a subsequent metal process is performed, an MIM capacitor may be formed to be composed of a lower electrode including tungsten (W) used as a contact material and an upper electrode including aluminum (Al) used for metal lines. One disclosed example can be used in any metal process as well as a process for forming a first metal of an M1 level. That is, such an MIM capacitor may be formed in an M2 or M3 level.

Figure 3:
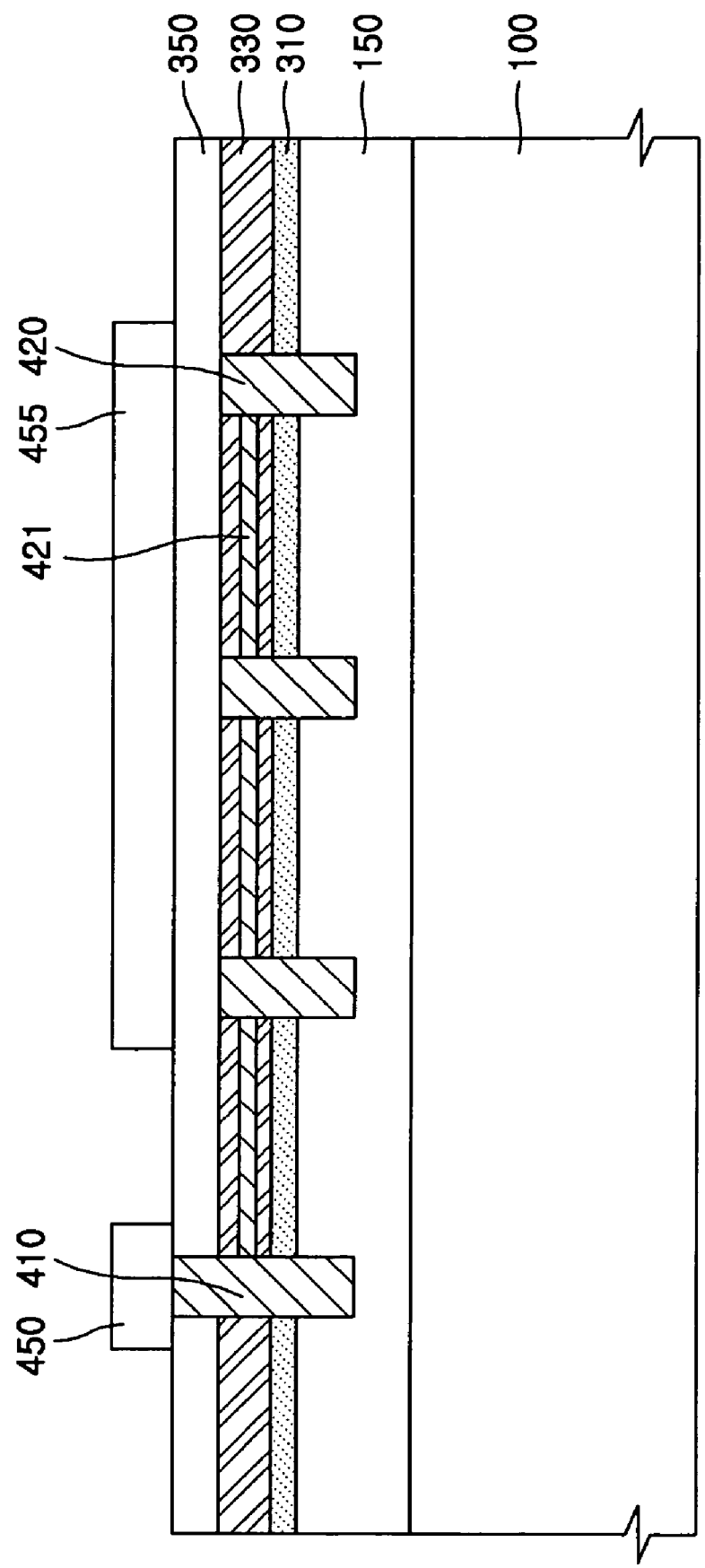
FIG. 3 is a cross-sectional view schematically illustrating an example disclosed methods of fabricating capacitors.

FIG. 3 is a schematic diagram illustrating an example method of fabricating an MIM capacitor. Referring to FIG. 3, the formation processes of gates, junctions, etc., among basic processes for a CMOS transistor are performed in the same way, as shown in FIG. 1.

After forming a transistor, as shown in FIG. 3, an insulating layer is introduced as a multi-layer structure on a semiconductor substrate 100 including a field oxide layer 150. Such an insulating layer may be generally formed as a deposited structure including two or three insulating layers, such as first, second, and third insulator layers 310, 330, and 350.

As disclosed herein, a void, as shown in FIG. 1, is intentionally created when such insulating layers 310, 330, and 350 are formed. By vertically increasing the height difference of the region where an MIM capacitor will be formed, such a void may be intentionally created in that region. For example, the height difference may be induced by introducing a polysilicon pattern on the field oxide layer 150, and a void may be consequently created by increasing the aspect ratio between polysilicon patterns. Such a polysilicon pattern may be formed together with a gate pattern which is introduced as a dummy pattern for the creation of the height difference.

In addition, the lowest insulating layer 310 among the insulating layers 310, 330, and 350 may be deposited as TEOS-based material, and the second insulating layer 330 is thickly deposited as a plasma enhanced oxide layer. Such a plasma enhanced oxide layer may create a void. The insulating layer structures 310 and 330 are consequently formed by thickly depositing another insulating layer (not shown) and performing a planarization process.

Subsequently, using a contact pattern for an MIM capacitor, first contacts 420 to be used for an electrode are formed in the region where a metal line will be formed. Thereafter, a process of depositing a line with tungsten (W) and an annealing process using a thermal process are performed. As a result, a lower electrode of an MIM capacitor is formed because melted tungsten may seep into a void created between the first contacts 420. At this time, a gap between the contacts 420 is closely formed in order for tungsten to easily seep into the void, and the size of a capacitor can be also differently formed by changing the gap between contacts 420.

Subsequently, tungsten left above the insulating layers 310 and 330 is removed by a Chemical Mechanical Polishing (CMP) or etch back scheme, and a dielectric layer 350 is formed by thinly depositing an insulating oxide layer.

Thereafter, tungsten is deposited again after forming a contact pattern used for connecting terminals of ordinary transistors other than a metal capacitor. At this time, a second contact 410 used for connecting a lower terminal of a metal capacitor may also be formed. Subsequently, a metal line 450 is formed by performing a process of forming a metal line of the M1 level, such as an aluminum (Al) line process, and an upper electrode 455 is formed on a dielectric layer 350 at the same time.

According to one disclosed example described above, an MIM capacitor required in the process of manufacturing semiconductor devices with high integration and high capacity can be formed. An MIM capacitor may be easily formed in the following process. That is, a lower electrode of a metal capacitor can be firstly formed by using tungsten required for forming a contact which is a necessary process of manufacturing semiconductor devices. Next, an upper electrode can be formed during the process of forming a metal line located right above the lower electrode. Therefore, the manufacturing cost of a metal capacitor can be reduced by eliminating both an additional mask and an insulating oxide layer which are normally required for fabricating such a metal capacitor. In addition, product development for customer needs can be quickly accomplished because such customer needs can be easily met by adjusting the thickness and size of an insulating oxide layer of a metal capacitor.

As disclosed above, the examples herein have been made in an effort to provide a method of fabricating a metal-insulator-metal (MIM) capacitor having advantages of eliminating an additional mask.

One example method of fabricating an MIM capacitor includes forming an insulating layer including a void on a semiconductor substrate, forming a first hole connected to the void by patterning the insulating layer, forming a lower electrode by forming a conductive layer filling in the first hole such that the conductive layer flows into the void, forming a dielectric layer covering the conductive layer, forming a second hole penetrating the dielectric layer and protruding toward the insulating layer, forming a connecting contact connected to the lower electrode by filling in the second hole, and forming an upper electrode on the dielectric layer.

The example method may also include forming a pattern for creating the height difference for inducing the void in the insulating layer. The pattern for creating the height difference may be formed together with a gate pattern of a transistor on the semiconductor substrate. The pattern for creating the height difference may include a polysilicon layer for the gate of the transistor on the semiconductor substrate. The insulating layer may include a plasma enhanced oxide layer so as to create the void in the insulating layer. The insulating layer may include a TEOS layer as a lower layer of the plasma enhanced oxide layer so as to create the void in the insulating layer.

In one example, the forming of the lower electrode may include forming a tungsten layer filling in the first hole, annealing the tungsten layer such that the tungsten may intrude into the void, and removing a portion of the tungsten layer protruding above the insulating layer.

Both the forming of the second hole and the forming of the connecting contact may be performed together while forming other connecting contacts for terminals of the transistor on the semiconductor substrate. The forming of the upper electrode may be performed while forming a wire for the operation of the transistor on the semiconductor substrate.

This application claims priority to and the benefit of Korean Patent Application No. 10-2004-0117163 filed in the Korean Intellectual Property Office on Dec. 30, 2004, the entire contents of which are incorporated herein by reference.

Although certain apparatus constructed in accordance with the teachings of the invention have been described herein, the scope of coverage of this patent is not limited thereto. On the contrary, this patent covers every apparatus, method and article of manufacture fairly falling within the scope of the appended claims either literally or under the doctrine of equivalents.

What is claimed is:

1. A method of fabricating a metal-insulator-metal capacitor, comprising:
    forming an insulating layer including a void on a semiconductor substrate;
    forming a first hole connected to the void by patterning the insulating layer;
    forming a lower electrode by forming a conductive layer filling in the first hole such that the conductive layer flows into the void;
    forming a dielectric layer covering the conductive layer;
    forming a second hole penetrating the dielectric layer and protruding toward the insulating layer;
    forming a connecting contact connected to the lower electrode by filling in the second hole; and
    forming an upper electrode on the dielectric layer.

2. The method of claim 1, further comprising forming a pattern for creating a height difference for inducing the void in the insulating layer.

3. The method of claim 2, wherein the pattern for creating the height difference is formed together with a gate pattern of a transistor on the semiconductor substrate.

4. The method of claim 3, wherein the pattern for creating the height difference includes a polysilicon layer for the gate of the transistor on the semiconductor substrate.

5. The method of claim 1, wherein the insulating layer includes a plasma enhanced oxide layer so as to create the void in the insulating layer.

6. The method of claim 5, wherein the insulating layer includes a TEOS layer as a lower layer of the plasma enhanced oxide layer so as to create the void in the insulating layer.

7. The method of claim 1, wherein the forming of the lower electrode comprises:
    forming a tungsten layer filling in the first hole;
    annealing the tungsten layer such that the tungsten may intrude into the void; and
    removing a portion of the tungsten layer protruding above the insulating layer.

8. The method of claim 1, wherein the forming of the second hole and the forming of the connecting contact are performed together while forming other connecting contacts for terminals of the transistor on the semiconductor substrate.

9. The method of claim 1, wherein the forming of the upper electrode is performed while forming a wire for the operation of the transistor on the semiconductor substrate.

* * * * *